(12) United States Patent
Takahashi et al.

(10) Patent No.: US 7,830,206 B2
(45) Date of Patent: Nov. 9, 2010

(54) AMPLIFIER CIRCUIT

(75) Inventors: Hajime Takahashi, Gunma (JP); Hiroshi Ikeda, Saitama (JP)

(73) Assignee: Sanyo Electric Co., Ltd. (JP)

( * ) Notice: Subject to any disclaimer, the term of this patent is extended or adjusted under 35 U.S.C. 154(b) by 509 days.

(21) Appl. No.: 11/863,710

(22) Filed: Sep. 28, 2007

(65) Prior Publication Data
US 2010/0045373 A1 Feb. 25, 2010

Related U.S. Application Data

(60) Provisional application No. 60/954,652, filed on Aug. 8, 2007.

(51) Int. Cl.
*H03F 1/26* (2006.01)

(52) U.S. Cl. .................... 330/51
(58) Field of Classification Search .......... 330/51; 381/94.5
See application file for complete search history.

(56) References Cited

U.S. PATENT DOCUMENTS 5,703,528 A * 12/1997 Nebuloni et al. ............ 330/51

* cited by examiner

*Primary Examiner*—Steven J Mottola
(74) *Attorney, Agent, or Firm*—Cantor Colburn LLP

(57) ABSTRACT

An extraction circuit is connected to an input path of an output amplifier. When the power is turned on, the extraction circuit extracts current on the basis of a difference between the normal rise of the supply voltage and a delayed supply voltage. Therefore, a steep rise in the input of the output amplifier when the power is turned on can be removed.

4 Claims, 2 Drawing Sheets

AMPLIFIER CIRCUIT

CROSS REFERENCE TO RELATED APPLICATION

This application claims priority to U.S. Provisional Application 60/954,652, filed Aug. 8, 2007, the entire disclosure of which is incorporated herein by reference.

BACKGROUND OF THE INVENTION

1. Field of the Invention

The present invention relates to an amplifier circuit for amplifying audio signals.

2. Description of the Related Art

Audio signals are output from CD, memory, record, tape, radio, television, and so forth, and these signals are then output from speakers. An output amplifier is used to amplify audio signals for output from these speakers. When the output signal level varies substantially in the output amplifier, pop noise is output from the speakers. Various circuits are known for preventing pop noise. In particular, since various circuits begin operation when the power is turned on, the changes at that time affect the output of the output amplifier so that pop noise is likely to be generated.

SUMMARY OF THE INVENTION

The present invention prevents pop noise by generating an extraction current on the basis of a difference between a supply voltage and a delayed supply voltage, which has its leading edge delayed from the supply voltage, and causing the extraction current to affect the output of the output amplifier.

DETAILED DESCRIPTION OF THE PREFERRED EMBODIMENTS

Figure 1:
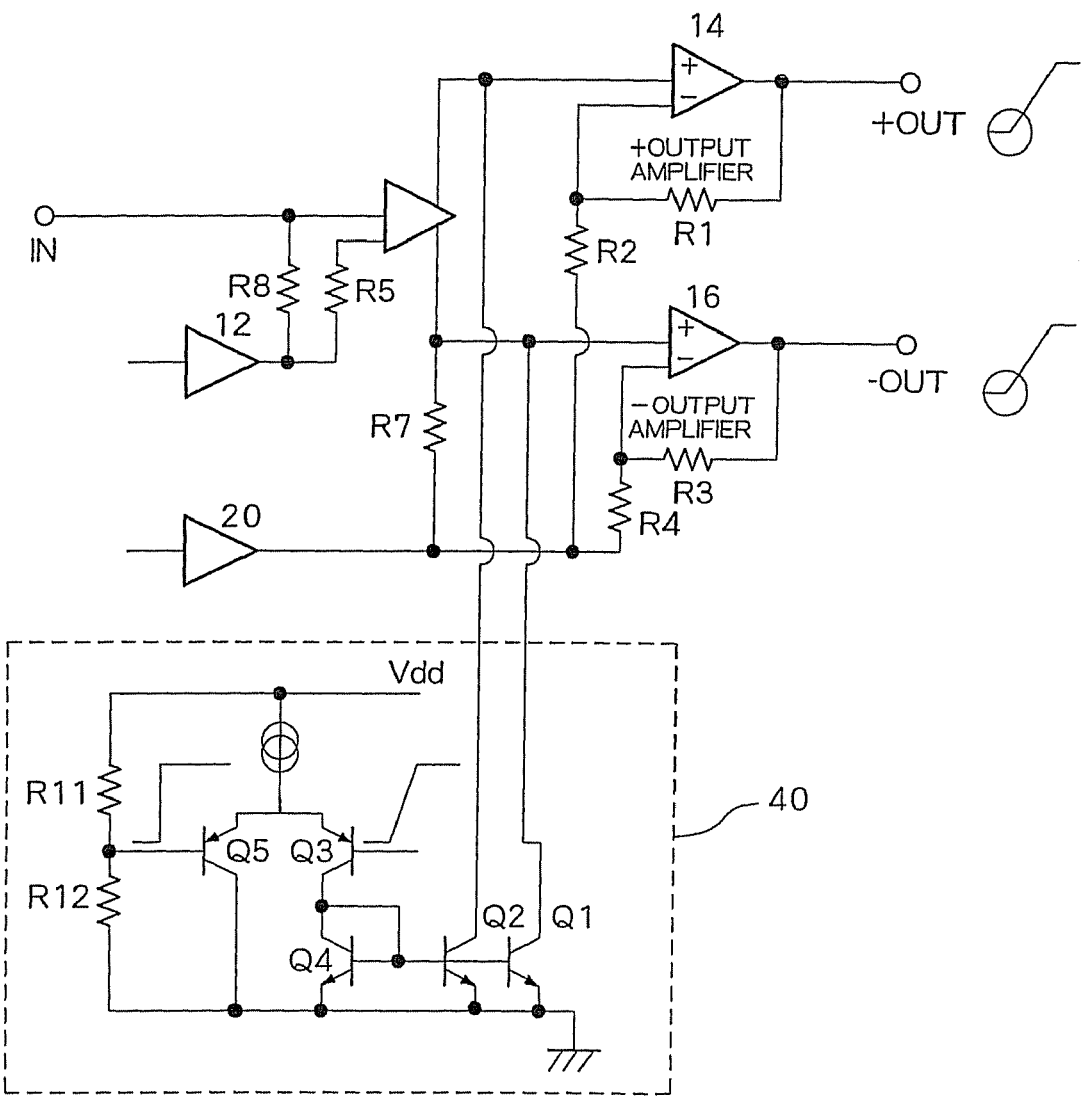
FIG. 1 shows a configuration of an amplifier circuit relating to an embodiment.

An embodiment of the present invention will be described hereinafter with reference to the attached drawings. FIG. 1 shows the configuration of the embodiment.

An audio signal is input by an input terminal IN. The input terminal IN is connected to one terminal (positive or negative terminal) of an input amplifier 10. Furthermore, an input reference amplifier 12 for generating a predetermined reference voltage is provided. An output of the input reference amplifier 12 is supplied to one terminal (negative or positive terminal) of the input amplifier 10 via a resistor R5. Furthermore, the output of the input reference amplifier 12 is also supplied to the other terminal of the input amplifier 10 via a resistor R6.

Therefore, a signal superimposed with the audio signal is output from the input amplifier 10 with the reference voltage (direct current voltage) in the output of the input reference amplifier 12 as reference. In this example, the input amplifier 10 has a pair of positive-negative output terminals and outputs two signals having opposite phases. The input amplifier 10 can be easily configured with a differential amplifier having a pair of differential transistors.

One output of the input amplifier 10 is input by a positive input terminal of an output amplifier 14 and the other output is input by a positive input terminal of an output amplifier 16. To a negative input terminal of the output amplifier 14 is connected an output of an output reference amplifier 20 via a resistor R2. Furthermore, an output terminal of the output amplifier 14 is fed back to the negative input terminal via a resistor R1. Therefore, the output of the output amplifier 10 is the direct current voltage from the output of the input reference amplifier 12 and the output of the output reference amplifier 20 to which an alternating current component of the input signal is superimposed.

Furthermore, to a negative input terminal of the output amplifier 16 is connected the output of the output reference amplifier 20 via a resistor R4 and the output terminal of the output amplifier 14 is fed back to the negative input terminal via the resistor R1. Therefore, the output of the output amplifier 10 is also a direct current voltage from the output of the input reference amplifier 12 and the output of the output reference amplifier 20 to which an alternating current component of the input signal is superimposed.

Furthermore, the output of the output reference amplifier 20 is connected to the output of the input amplifier 10 via a resistor R7. Although it is shown in the figure as connected to one output of the input amplifier 10, the output amplifier 10 has a differential amplifier configuration so that the direct current component of the output is identical. Therefore, in terms of direct current, the output of the output reference amplifier 20 is connected to the two outputs of the input amplifier 10 via the resistor R7.

The embodiment has an extraction circuit 40, which is connected to the outputs (positive input terminals of output amplifiers 14, 16) of the input amplifier 10.

Next, the configuration of the extraction circuit 40 will be described. A resistor R11 and a resistor R12 connected in series are located between a supply line Vdd set with supply voltage Vdd and ground. Therefore, a voltage, which is the supply voltage Vdd divided by the resistance ratio of resistor R11 and resistor R12, is obtained at the connection point of the resistor R11 and resistor R12.

To the supply line Vdd are connected the emitters of two PNP transistors Q3 and Q5 via a constant current supply 42. Transistor Q5 has its collector connected to ground and base connected to the connection point of resistor R11 and resistor R12. Furthermore, the collector of the transistor Q3 is connected to the collector of the NPN transistor Q4 and the emitter of the transistor Q4 is connected to ground.

Moreover, transistor Q4 has its collector and base short circuited (diode connected) and to the base are connected the bases of NPN transistors Q1 and Q2. The emitters of transistors Q1 and Q2 are connected to ground. Therefore, transistors Q1 and Q2 form a current mirror with transistor Q4.

The collectors of transistors Q1 and Q2 are respectively connected to the positive input terminals (two outputs of input amplifier 10) of output amplifiers 14 and 16.

Figure 2:
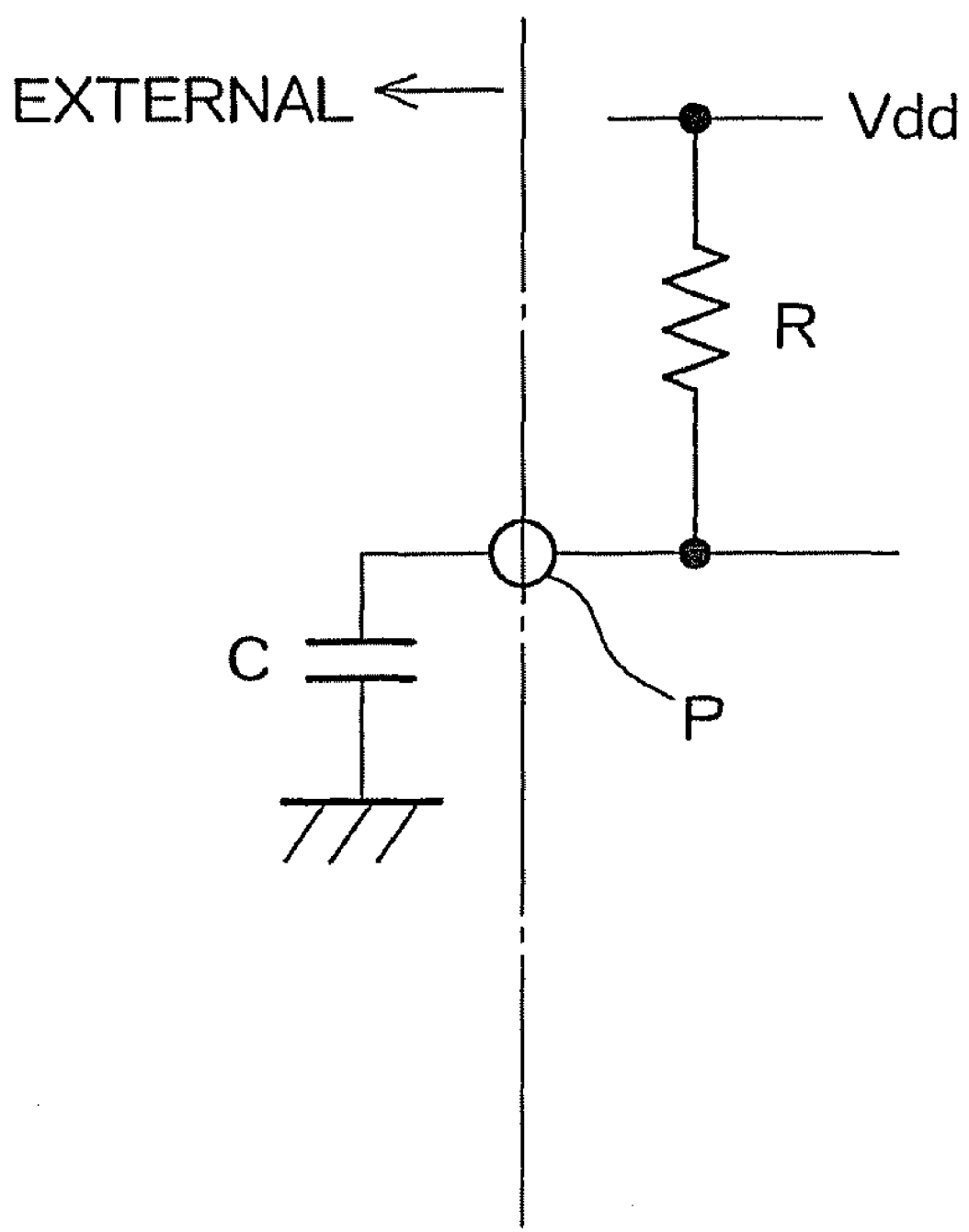
FIG. 2 shows a circuit for delaying the leading edge of a supply voltage Vdd.

Although this circuit is formed within one semiconductor integrated circuit, the above-mentioned circuit for creating a delayed input to the base of transistor Q3 has an externally connected capacitor. Namely, as shown in FIG. 2, the supply line Vdd is connected to one terminal of an externally connected capacitor C via a resistor R and a pin P. The other terminal of the externally connected capacitor C is connected to ground. Therefore, when the supply voltage Vdd rises, the voltage at pin P rises at a time constant determined according to the resistance of resistor R and the capacitance of capacitor C.

Pin P is connected to the base of transistor Q3. It is preferable to also have another circuit connected to pin P. For example, after the supply voltage has sufficiently risen, permission for a circuit to be activated or a signal to be output may be controlled according to a rise completion signal that is obtained by comparing the voltage at pin P with a predetermined threshold voltage.

When power is turned on this circuit, voltage is supplied to the circuit and the supply voltage Vdd rises. As a result, the supply voltage Vdd is supplied to the input reference amplifier 12, input amplifier 10, output amplifiers 14 and 16, output reference amplifier 20, and so forth, and these circuits begin to operate. In particular, when the output reference amplifier 20 begins operation, the output rises to a certain degree together with the rise in the supply voltage Vdd.

On the other hand, in the extraction circuit 40, the base of transistor Q3 rises at a predetermined time constant. For this reason, transistor Q5 continues to let current flow according to the rise of the supply voltage Vdd and transistor Q3 lets current flow according to the rising voltage at the predetermined time constant. Thus, transistors Q5 and Q3 are PNP transistors and transistor Q3 having a lower base voltage lets substantial current flow until the base voltage rises to Vdd. Namely, when the supply voltage Vdd rises, the base voltage of transistor Q3 rises with a delay at the predetermined time constant, and a current flows to transistor Q3 according to the difference between this delayed supply voltage d-Vdd and the supply voltage Vdd, and then flows to transistors Q1 and Q2 via transistor Q4. Namely, until the delayed supply voltage d-Vdd reaches the supply voltage Vdd, a current flows to transistor Q3 according to the voltage difference.

Therefore, when power is turned on, a current based on the above-mentioned difference is subtracted from the input side of output amplifiers 14 and 16 at the rise of the supply voltage Vdd. The steep rise that occurred in the outputs of the output amplifiers 14 and 16 when the power is turned on can be prevented and the pop noise that is generated by supplying these outputs to a speaker can be prevented.

As shown in FIG. 1, the output at the output reference amplifier 20 is set so as to gradually rise when power is turned on. Namely, the input signal is set to gradually rise so that the output also gradually rises. However, when power is turned on at the amplifier, the output thereof rises to a constant voltage as the operation of the amplifier begins. An object of the embodiment is to prevent a rise in the output when the output reference amplifier 20 is turned on. When the supply voltage Vdd rises as the power is turned on and the operation of the output reference amplifier 20 begins, the rise in the output thereof is suppressed by the above-mentioned extraction circuit 40 and the steep rise in the outputs of the output amplifiers 14 and 16 can be prevented.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. An amplifier circuit comprising:
   an output reference amplifier for outputting an output reference voltage;
   an output amplifier for receiving the output reference voltage and an input signal and for outputting an output signal obtained by changing a direct current level of the input signal corresponding to the output reference voltage; and
   a current extraction circuit for extracting an extraction current from an input of said output amplifier;
   wherein said current extraction circuit extracts a current on the basis of a difference between a supply voltage and a delayed supply voltage, which has a leading edge delayed from the supply voltage, as the extraction current.

2. An amplifier circuit according to claim 1, wherein:
   said extraction circuit comprises a pair of differential transistors connected in common to a constant current circuit;
   a voltage corresponding to the supply voltage is input by a control terminal of one differential transistor, a voltage corresponding to a delayed supply voltage, which is said supply voltage rising with a delay at a predetermined time constant, is supplied to a control terminal of the other differential transistor, and the extraction current is generated on the basis of a difference between currents of the pair of differential transistors during a period until the delayed supply voltage reaches the supply voltage.

3. An amplifier circuit according to claim 1, wherein:
   said output amplifier inputs the output reference voltage at a negative input terminal and inputs the input signal at a positive input terminal.

4. An amplifier circuit according to claim 3 further comprising:
   two output amplifiers;
   wherein the two output amplifiers respectively have input signals of opposite polarities and from the two output amplifiers are obtained output signals of opposite polarities.

* * * * *